US006984580B2

(12) United States Patent
Dostalik et al.

(10) Patent No.: US 6,984,580 B2
(45) Date of Patent: Jan. 10, 2006

(54) DUAL DAMASCENE PATTERN LINER

(75) Inventors: William W. Dostalik, Plano, TX (US); Robert Kraft, Plano, TX (US); Kenneth D. Brennan, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 141 days.

(21) Appl. No.: 10/789,338

(22) Filed: Feb. 26, 2004

(65) Prior Publication Data

US 2004/0222529 A1 Nov. 11, 2004

Related U.S. Application Data

(62) Division of application No. 10/430,558, filed on May 6, 2003.

(51) Int. Cl.
*H01L 21/4763* (2006.01)

(52) U.S. Cl. ....................... 438/622; 438/637; 438/675

(58) Field of Classification Search ................ 438/622, 438/637, 675

See application file for complete search history.

(56) References Cited

U.S. PATENT DOCUMENTS

| | | | | |
|---|---|---|---|---|
| 6,319,809 | B1 | 11/2001 | Chang et al. | |
| 6,372,647 | B1 | 4/2002 | Lu et al. | |
| 6,908,846 | B2 * | 6/2005 | McMillin et al. | 438/622 |
| 2002/0081855 | A1 | 6/2002 | Jiang et al. | |
| 2004/0084774 | A1 * | 5/2004 | Li et al. | 257/758 |

OTHER PUBLICATIONS

S. Satyanarayana et al., “A Solution to Resist Poisoning in the Integration of 248 and 193 nm Photoresist with Low-k Dielectric Materials” Society of Photo-Optical Instrumentation Engineers, Santa Clara, California, Mar. 2002.

* cited by examiner

*Primary Examiner*—Phat X. Cao
(74) *Attorney, Agent, or Firm*—Rose Alyssa Keagy; W. James Brady, III; Frederick J. Telecky, Jr.

(57) ABSTRACT

An embodiment of the invention is a dual damascene layer 13 of an integrated circuit 2 containing a dual damascene pattern liner 21. Another embodiment of the invention is a method of manufacturing dual damascene layer 13 where a dual damascene pattern liner 21 is formed over a cap layer 25 and within via holes. Yet another embodiment of the invention is a method of manufacturing dual damascene layer 13 where a dual damascene pattern liner 21 is formed over a cap layer 25 and within trench spaces.

21 Claims, 15 Drawing Sheets

DUAL DAMASCENE PATTERN LINER

This is a division of application Ser. No. 10/430,558, filed May 6, 2003, the entire disclosure of which is hereby incorporated by reference.

BACKGROUND OF THE INVENTION

This invention relates to the addition of a dual damascene pattern liner to the trenches or vias of the Back-End-Of-Line section of an integrated circuit.

DETAILED DESCRIPTION OF THE INVENTION

Figure 1:
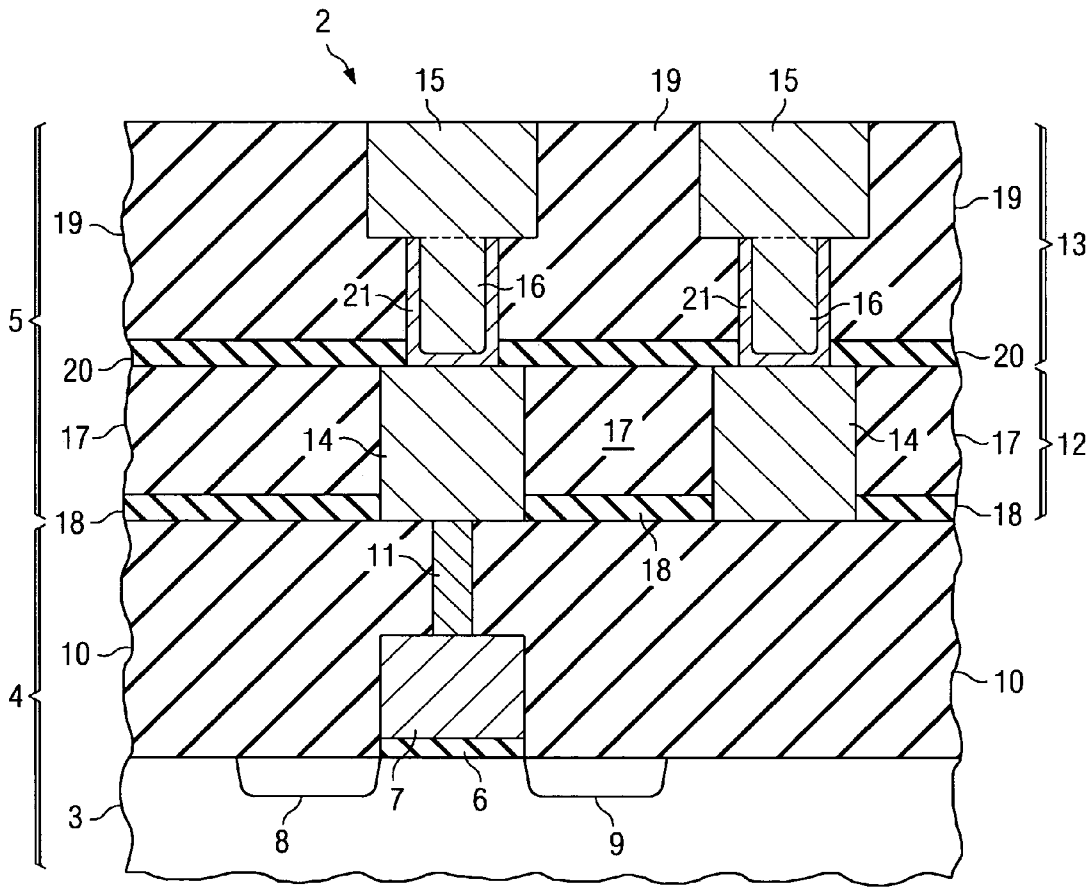
FIG. 1 is a cross-section view of a partial integrated circuit in accordance with a first embodiment of the present invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-section view of a partial integrated circuit 2 in accordance with a first embodiment of the present invention. The integrated circuit fabrication or process flow is divided into two parts: the Front-End-Of-Line (FEOL) section 4 and the Back-End-Of-Line (BEOL) section 5. The part that includes the silicon substrate 3 is called the FEOL section 4 of the integrated circuit 2. In general, the FEOL 4 is the transistor layer formed on (and within) the semiconductor substrate 3. The partial FEOL 4 shown in FIG. 1 includes a transistor having a gate oxide 6, a gate electrode 7, and source/drain 8, 9; however, it is within the scope of the invention to have any form of logic within the FEOL section 4.

Immediately above the transistor is a layer of dielectric insulation 10 containing metal contacts 11 that electrically tie the transistor to the other logic elements (not shown) of the FEOL section 4. As an example, the composition of dielectric insulation 10 may be $SiO_2$ and contacts 11 may comprise W.

The BEOL 5 contains a single damascene metal layer 12 and at least one dual damascene layer 13. Layers 12 and 13 contain metal lines, 14 and 15 respectively, that properly route electrical signals and power properly through the electronic device. Layer 13 also contains vias 16 that properly connect the metal lines of one metal layer (e.g. 14) to the metal lines of another metal layer (e.g. 15).

The single damascene metal layer 12 has metal lines 14 electrically insulated by dielectric material 17. As an example, the metal lines 14 may contain any metal such as copper and the dielectric material 17 may be any insulative material such as tetraethyl orthosilicate (TEOS). Furthermore, the single damascene metal layer 12 may have a thin dielectric layer 18 formed between the dielectric material 17 and the FEOL 4. It is within the scope of this invention to use any suitable material for the dielectric layer 18. For example, the dielectric layer 18 may comprise SiCN. The dielectric layer 18 may perform many functions. For example, dielectric layer 18 may function as a barrier layer; preventing the copper from interconnects 14 from diffusing to the silicon channel of the transistor or to another isolated metal line (thereby creating an electrical short). Second, dielectric layer 18 may function as an etch stop when manufacturing the metal lines 14 within the dielectric insulation material 17. Lastly, the dielectric layer 18 may function as an adhesion layer to help hold a layer of TEOS 17 to the FEOL 4 or to the dual damascene layer 13. For purposes of readability, the dielectric layer 18 will be called the barrier layer 18 during the rest of the description of this invention.

Referring again to FIG. 1, the dual damascene layer 13 contains metal lines 15 and vias 16 that are electrically insulated by dielectric material 19. The metal lines 15 may contain any metal such as copper. However, the use of other metals such as aluminum or titanium is within the scope of this invention In accordance with one embodiment of the invention, the dielectric material 19 is a low-k material such as OSG. Specifically, dielectric material 19 may be an OSG material such as CORAL (manufactured by Novellus). The dual damascene layer 13 may also contain a barrier layer 20 that serves as a via etch stop layer during manufacturing. Any suitable dielectric material, such as SiN or SiCN, may be used as the via etch stop layer 20. The via etch stop layer 20 may even be comprised of the same material as barrier layer 18.

In accordance with the best mode of the present invention, the dual damascene layer 13 has a dual damascene pattern liner 21. The dual damascene pattern liner 21 is used during manufacturing (as described below) to ensure the proper formation of the metal lines 15 and 16. The dual damascene pattern liner 21 supports proper metal line formation because it facilitates proper trench patterning by protecting the photoresist from poisoning. It is within the scope of this invention to use one or more thin films to create the dual damascene pattern liner 21. Furthermore, it is within the scope of this invention to use any suitable material or layers of materials to create the dual damascene pattern liner 21. For example, either metal barrier films (such as TiSiN, TiN, or TaN) or dielectric barrier films (such as SiN, SiC, or SiON) may be used to create the dual damascene pattern liner 21. In the best mode application shown in FIG. 1, the dual damascene pattern liner 21 is formed during a "via first" process (explained more fully below) after the via hole has been etched through the low-k dielectric 19 and the via etch stop 20. Furthermore, the dual damascene pattern liner 21 is comprised of TiSiN and it is electrically coupled to via 16 and to metal line 14.

Figure 2:
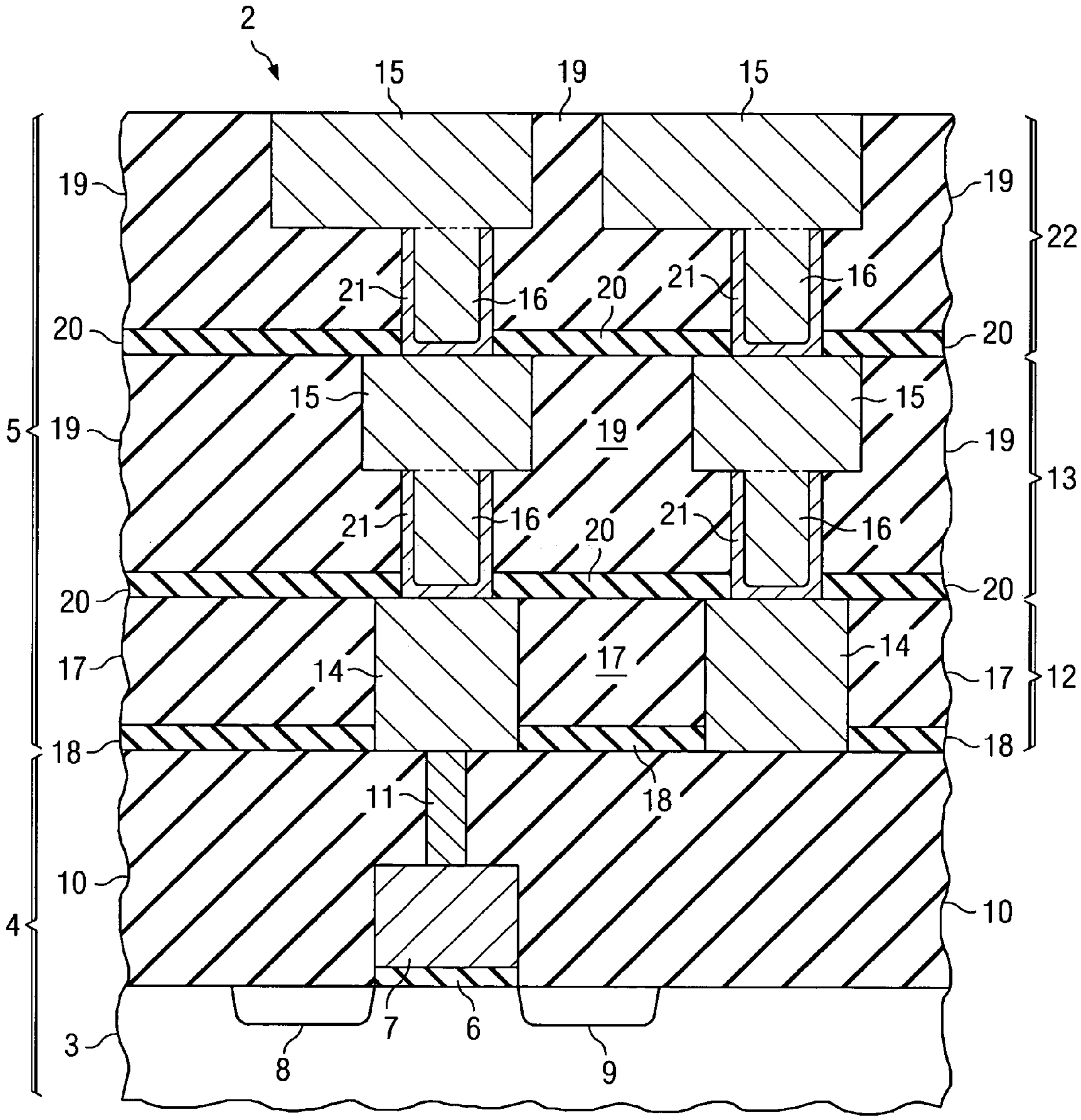
FIG. 2 is a cross-section view of a partial integrated circuit in accordance with a second embodiment of the present invention.
Figure 3:
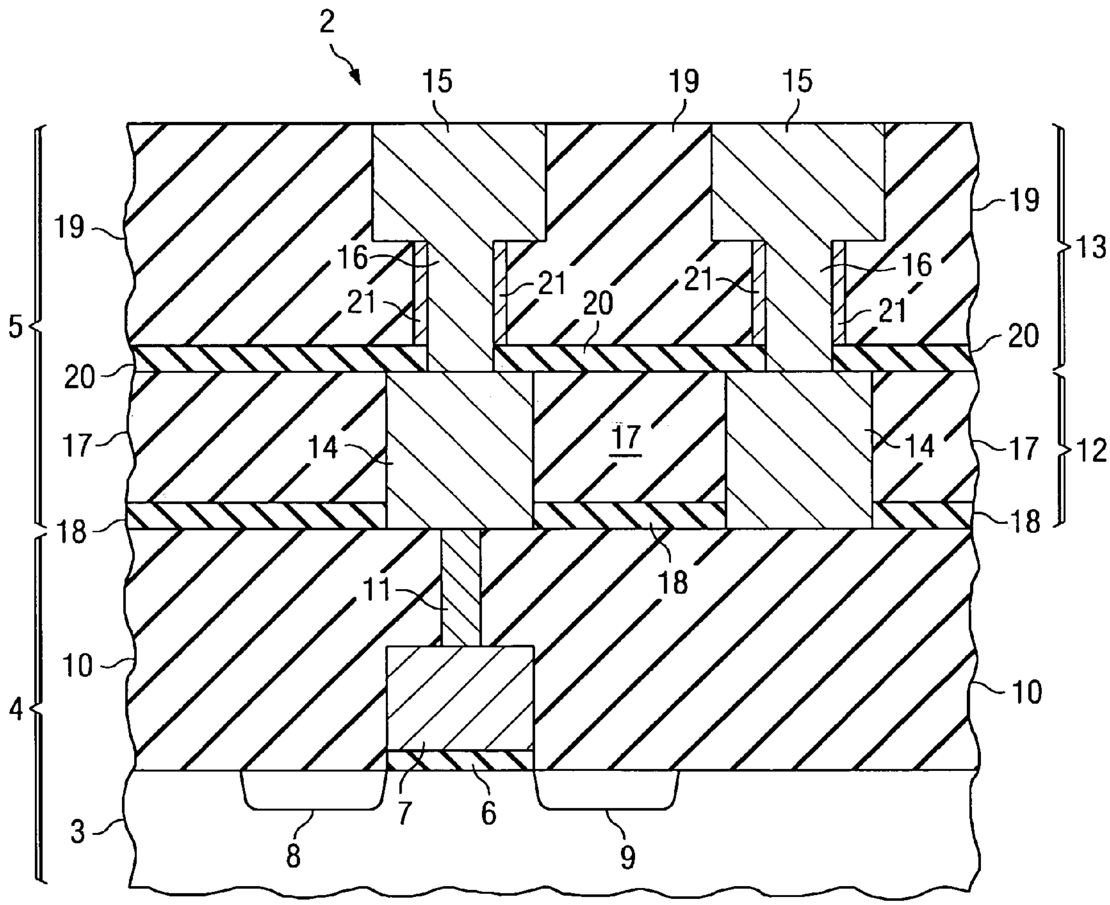
FIG. 3 is a cross-section view of a partial integrated circuit in accordance with a third embodiment of the present invention.
Figure 4:
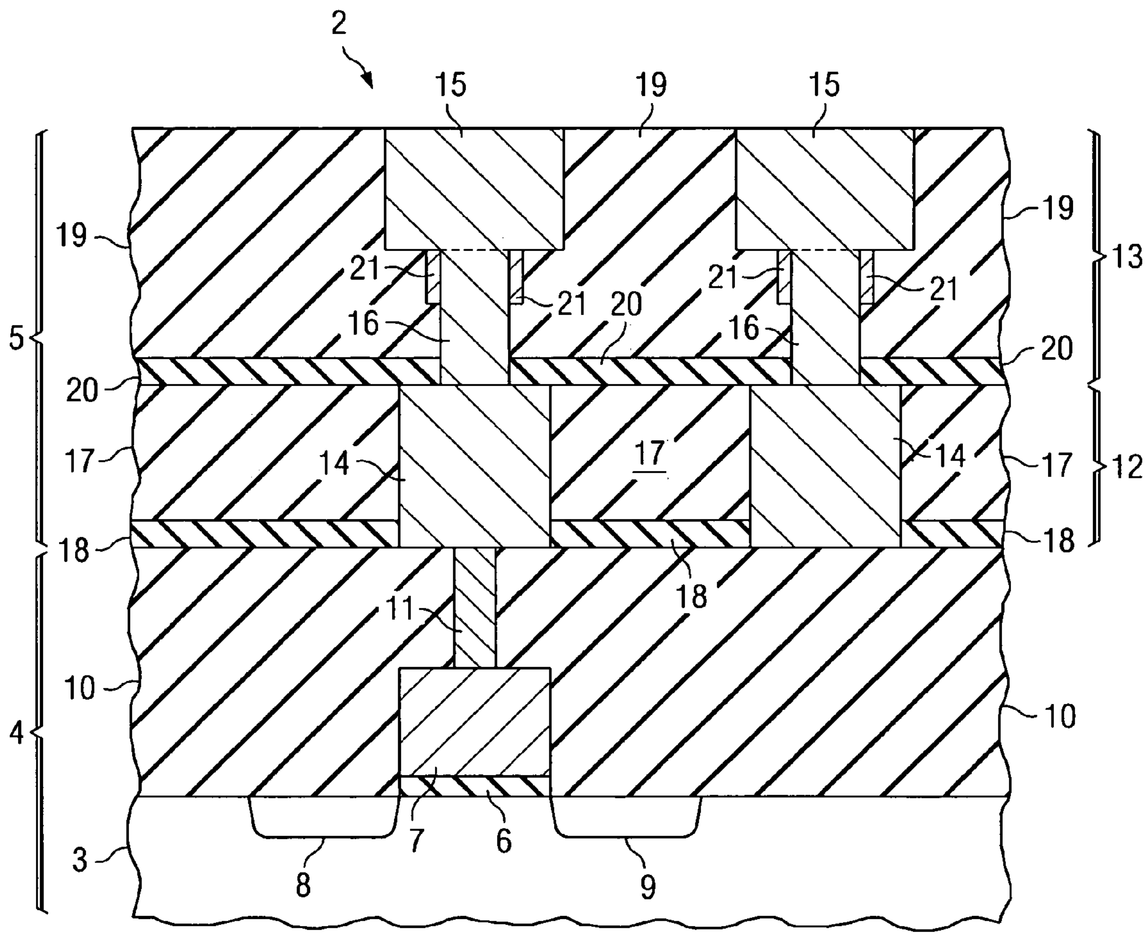
FIG. 4 is a cross-section view of a partial integrated circuit in accordance with a fourth embodiment of the present invention.

It is within the scope of this invention to use a dual damascene pattern liner 21 in any one of many configurations. For example, instead of using a dual damascene pattern liner 21 in one dual damascene layer 13, the dual damascene pattern liner 21 may be used in more than one consecutive or nonconsecutive dual damascene layers 13, 22, as shown in FIG. 2. As another example, the dual damascene pattern liner 21 may be shaped generally as shown in FIG. 3 if the dual damascene pattern liner 21 is formed during a via first process that etches the via etch stop layer 20 when the holes for the trenches are formed (as discussed below). In addiction, if the dual damascene pattern liner 21 is formed during a partial via etch process (explained below) then the dual damascene pattern liner 21 will be shaped generally as shown in FIG. 4. Moreover, if the dual damascene pattern liner 21 is formed during a "trench first" process (described below), then the dual damascene pattern liner 21 will be formed in the trench, as generally shown in FIG. 5.

Figure 5:
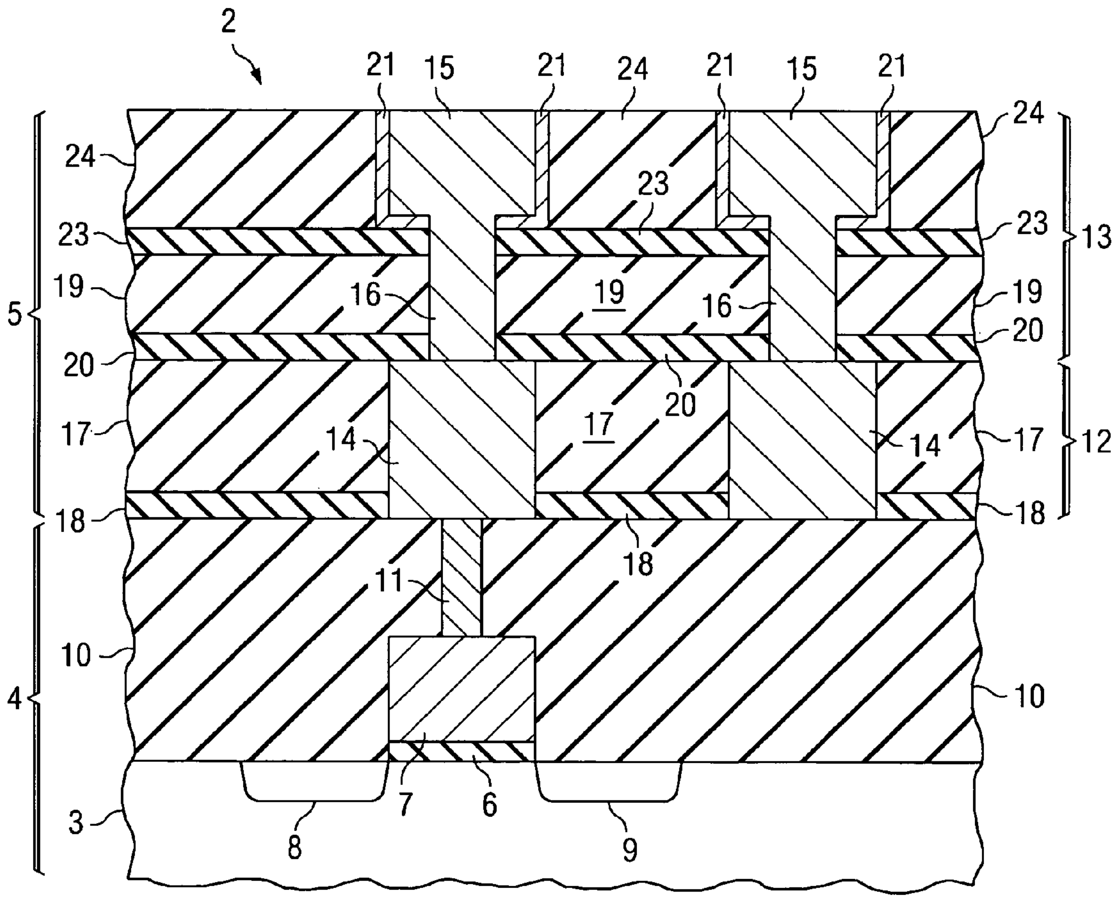
FIG. 5 is a cross-section view of a partial integrated circuit in accordance with a fifth embodiment of the present invention.

An example variation of the dielectric layer for the dual damascene layer 13 is also shown in FIG. 5. The example dielectric layer is a stack comprised of the low-k dielectric 19, a barrier layer 23 (that may function as a trench stop), and another dielectric layer 24. The barrier layer may be the same material as the via etch stop 20 or a different dielectric material may be used. In addition, the dielectric layer 24 may be the same low-k material used for barrier layer 19. Moreover, either dielectric layer 19 or dielectric layer 24 may be a completely different dielectric material such as TEOS, FSG, PSG, BPSG, PETOS, HDP oxide, a silicon nitride, silicon oxynitride, silicon carbide or silicon carbo-oxy-nitride (possibly used because it is less expensive). This alternative dielectric configuration could be used in one or more dual damascene layers (such as those shown in FIGS. 1–4).

Figure 6:
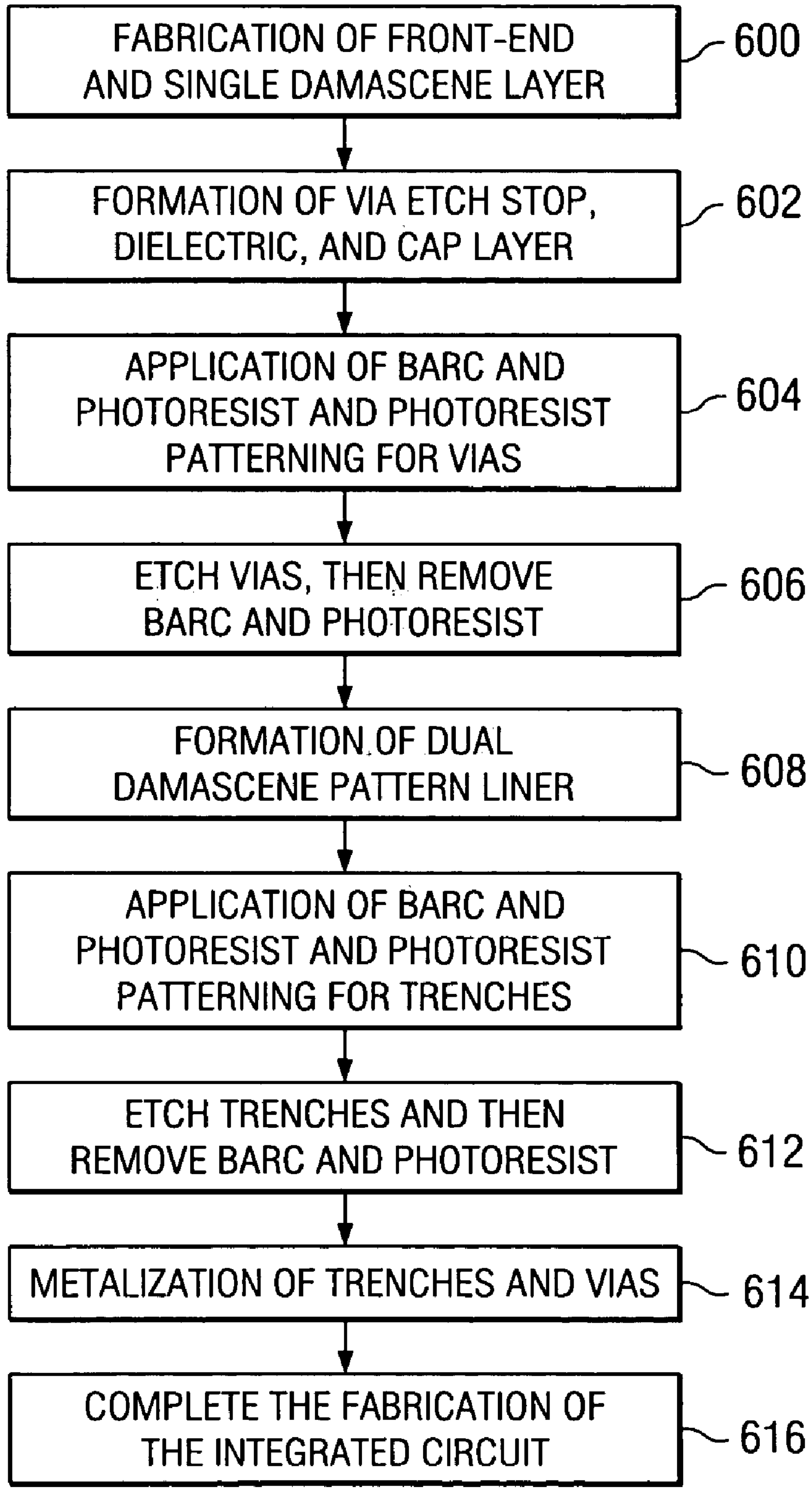
FIG. 6 is a flow chart illustrating the process flow of the present invention.

Referring again to the drawings, FIG. 6 is a flow diagram illustrating the process flow of the present invention. Other than process step 608, the process steps should be those standard in the industry.

The present invention may be used in any integrated circuit configuration; therefore the first step is to fabricate the front-end section 4 (step 600) to create any logic elements necessary to perform the desired integrated circuit function. In addition, the single damascene metal layer 12 of the BEOL 5 is fabricated over the FEOL 4.

Referring now to FIGS. 6, 7A–G, and 8A–B; a barrier layer 20 is now formed (step 602, FIG. 7A) over the entire substrate. The barrier layer 20 functions as a via etch stop layer and it my be formed using any manufacturing process such as Plasma-Enhanced Chemical Vapor Deposition ("PECVD"). In this example application, the barrier layer 20 is comprised of SiC; however, other dielectric materials such as SiN or SiCN may be used.

Next a low-k dielectric layer 19 is formed (step 602, FIG. 7A) over the entire substrate (i.e. over the barrier layer 20). The low-k dielectric material may be applied to the substrate with a Chemical Vapor Deposition ("CVD") or a spin-on manufacturing process. In the example application, the dielectric layer 19 is an OSG such as CORAL (manufactured by Novellus). However, any other low-k dielectric, or a combination or stack thereof may be used. For example, the dielectric layer may be the dielectric stack configuration shown in FIG. 5.

Now, a cap layer 25 is formed (step 602, FIG. 7A) over the entire substrate (i.e. over the dielectric layer 19). The cap layer ensures the proper formation of the photoresist pattern (described below). In the example application, the cap layer is a dielectric material such as TEOS, SiN, or SiC, and it is applied with any well-known manufacturing process such as PECVD.

Figure 7A:
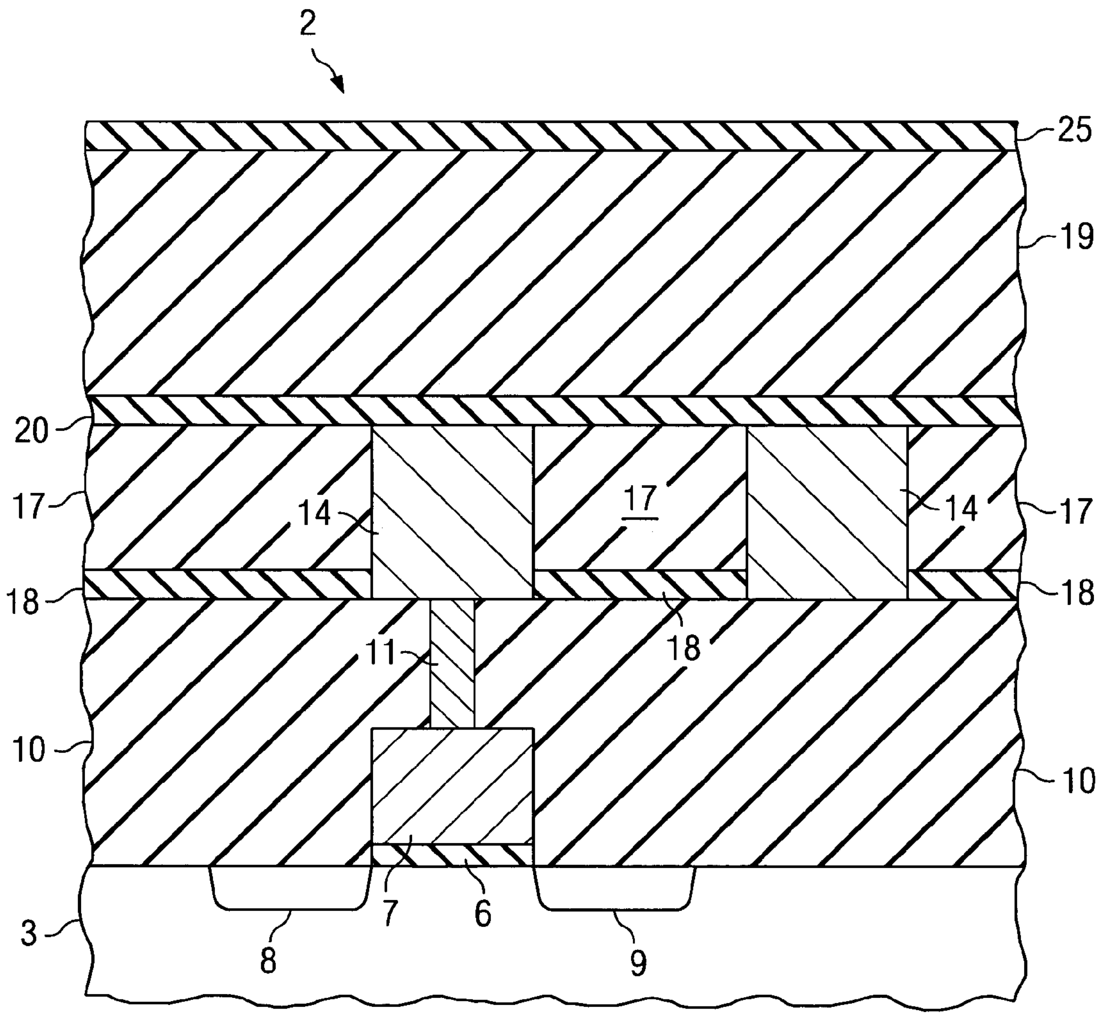
FIGS. 7A–7G are cross-sectional diagrams of a process for forming a dual damascene pattern liner in accordance with the present invention.
Figure 7B:
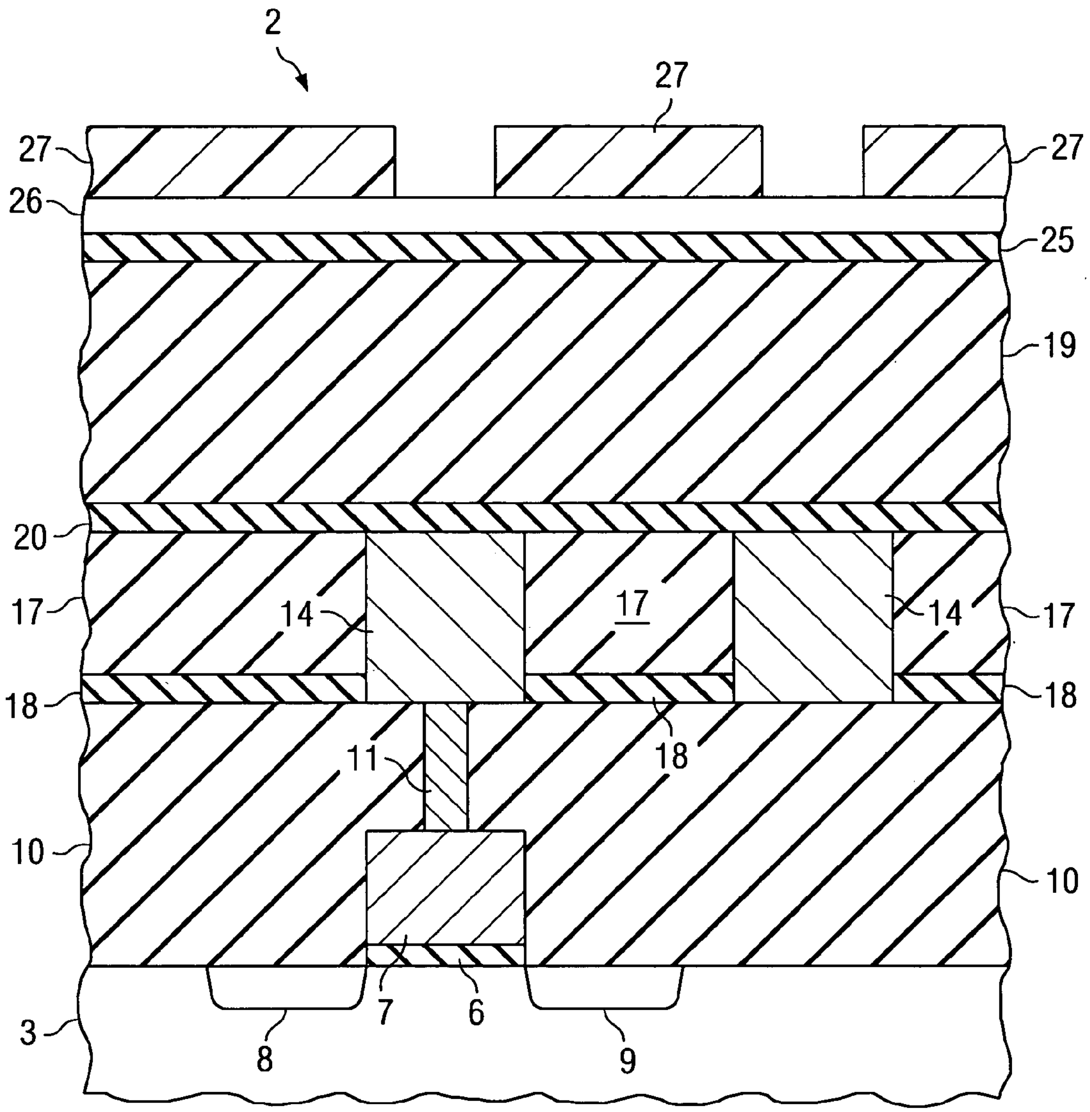
Figure 7C:
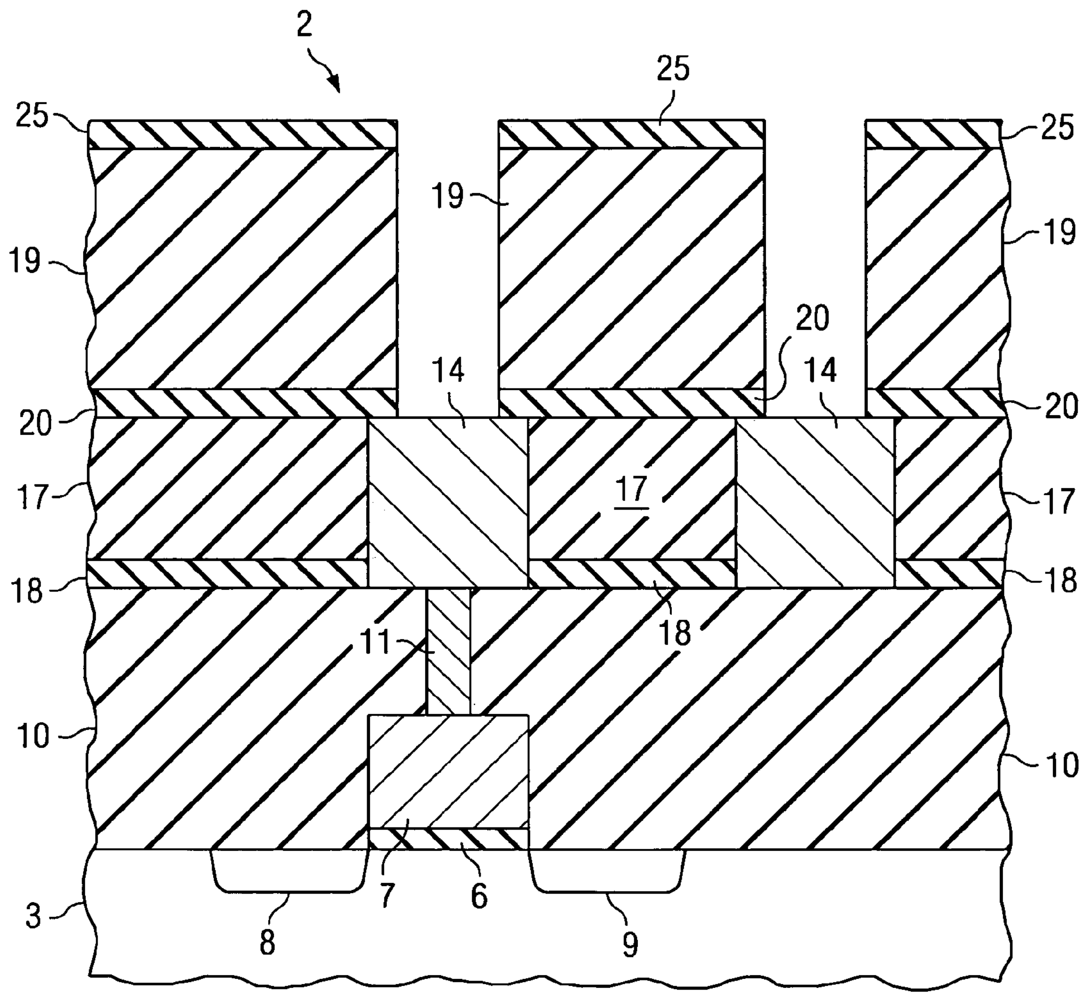

Step 604 starts with forming a bottom anti-reflection coating ("BARC"), over the cap layer 25, as shown in FIG. 7B. The BARC layer 26 is comprised of an organic non-photoactive material (possibly Shipley AR19) that may be applied with a spin-on process. Next, a layer of photoresist 27 is applied and then patterned by a lithography process. In this example application the hole for the via is formed first, therefore, this is called a "via first" process. As shown in FIG. 7B a via pattern is created once the photoresist is developed.

Now the holes for the vias are etched using any well-known manufacturing process such as fluorocarbon-based plasma etch (step 606). In this example process the via hole is etched through the cap layer 25, the dielectric layer 19, and the dielectric layer 20. However, various via-first process flows are within the scope of this invention. For example, the dielectric layer 20 may not be etched at this time (rather it is etched in a later process). Or, a partial via etch may be performed (and then the via etch is completed in a later process). Once the via holes have been etched, the BARC 26 and photoresist 27 is removed by an ash process, resulting in the structure shown in FIG. 7C.

In the via-first process, the next step is to create the pattern for the trenches. However, applying a second layer of BARC and photoresist, and then developing the photoresist to create the trench pattern is problematic. After the via etch and ash (step 606) the dielectric layer 19 and possibly the barrier layer 20 is exposed inside the via pattern (see FIG. 7C). During a subsequent trench patterning the photoresist is no longer protected from potential poisoning agents (such as N) from the contiguous dielectric layer 19 and cap layer 25; and it may be in direct contact with the interior of dielectric layer 19 and possibly dielectric barrier layer 20. The interaction of the photoresist 27 with low-k materials (e.g. 19), barrier layers (e.g. 20), process chemicals, and environmental contamination causes the photoresist 27 to be poisoned. Therefore, the photoresist does not develop properly and extra (undeveloped) photoresist will remain on the substrate. As a result, the trench pattern will not match the reticle pattern used in the lithography step.

Figure 7D:
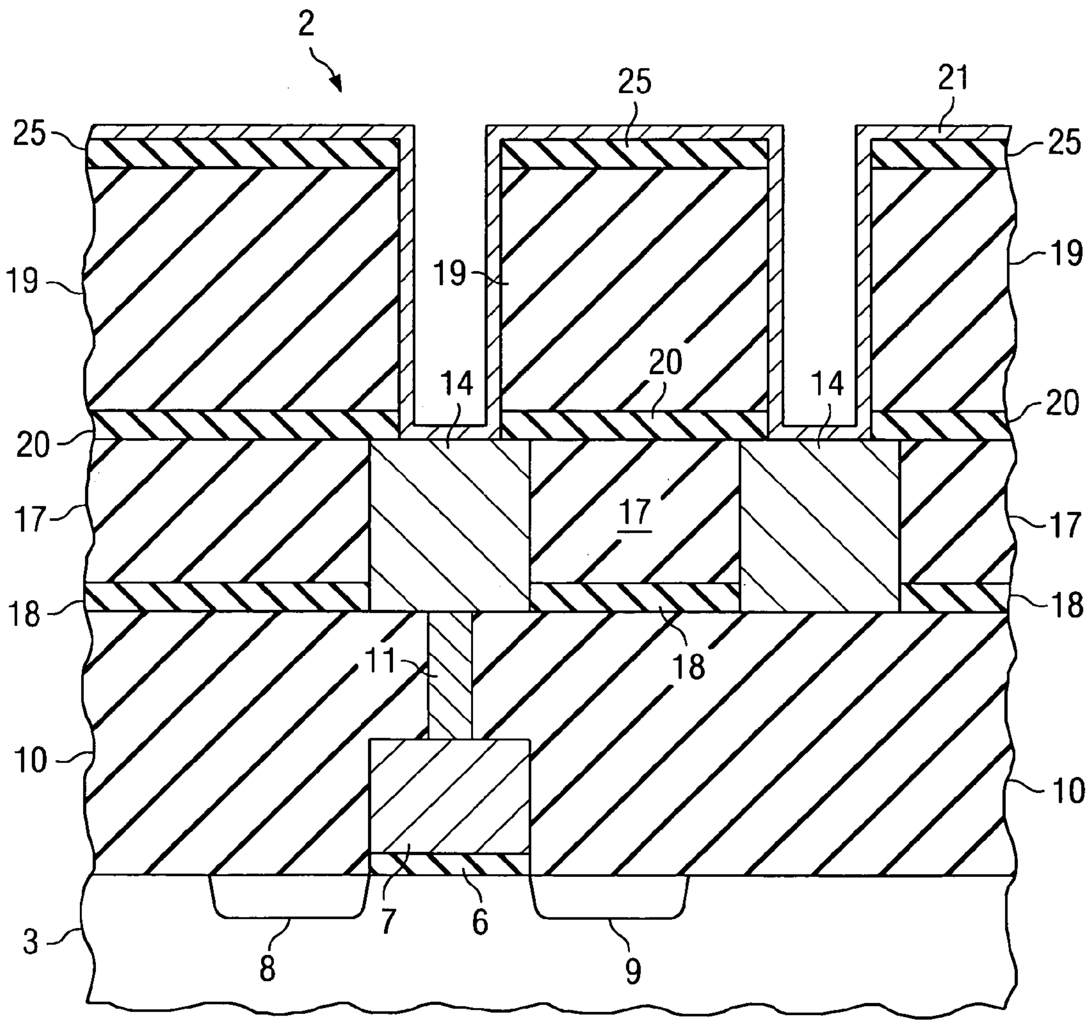

In accordance with the invention, photoresist poisoning is eliminated by forming a dual damascene pattern liner 21 (step 608) over the substrate as shown in FIG. 7D. In the best mode application, the dual damascene pattern liner 21 is TiSiN. However, the use of other materials is within the scope of this invention. For example, the dual damascene pattern liner may be other metal barrier films such as TiN or TaN, or dielectric barrier films such as SiN, SiC, or SiON, or any combination or stack thereof. Furthermore, the dual damascene pattern liner 21 may be a combination of more than one film, such as a dielectric film within a metal film. The use of a metal film (either alone or in combination with a dielectric film) would protect the metal in the vias 15 and/or 16 from seeping into the low-k dielectric layer 19.

Moreover, it is within the scope of this invention to use a range of thicknesses for the dual damascene pattern liner 21. Specifically, the dual damascene pattern liner 21 can be a thin as a monolayer or as thick as the pattern feature will allow. However, in the preferred application, the thickness of the dual damascene pattern liner 21 is approximately 5% of the pattern feature width.

Figure 7E:
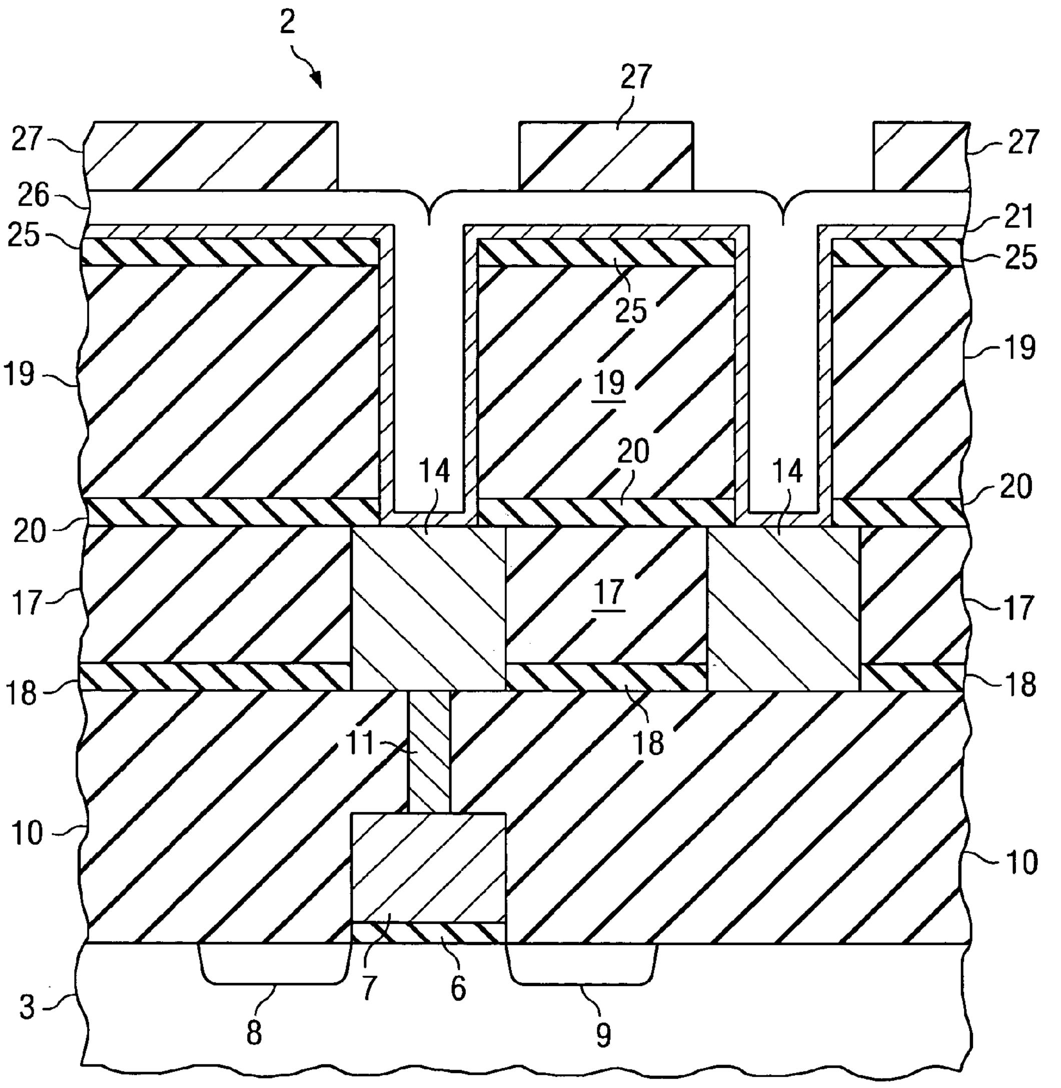
Figure 7F:
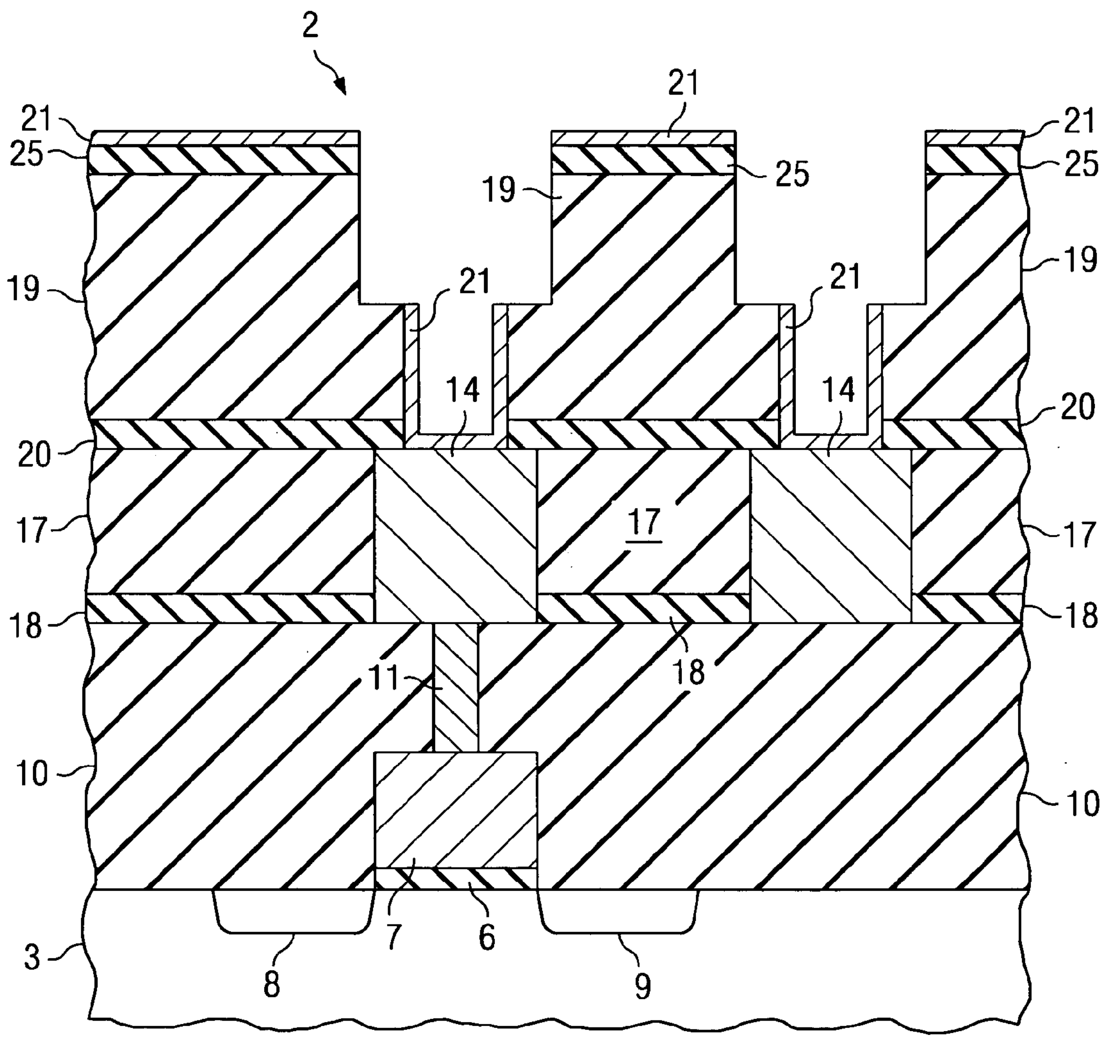

Once the dual damascene pattern liner 21 is formed then the trenches are patterned. As shown in FIG. 7E (step 610), a layer of BARC 26 is formed over the substrate. The BARC layer covers the dual damascene pattern liner 21 and plugs the via holes. Then a layer of photoresist 27 is applied, patterned, developed and ashed to create the template for the trench patterning.

In step 612 the trenches are etched using any well-known manufacturing process such as fluorocarbon-based plasma etch. If a trench stop layer was formed within the dielectric layer 19 then it is used to create the proper trench depth. Otherwise, the trench depth is controlled through manufacturing process techniques. Once the trenches have been etched then an ash process removes the BARC 26 and photoresist 27, resulting in the structure shown in FIG. 7F.

Figure 7G:
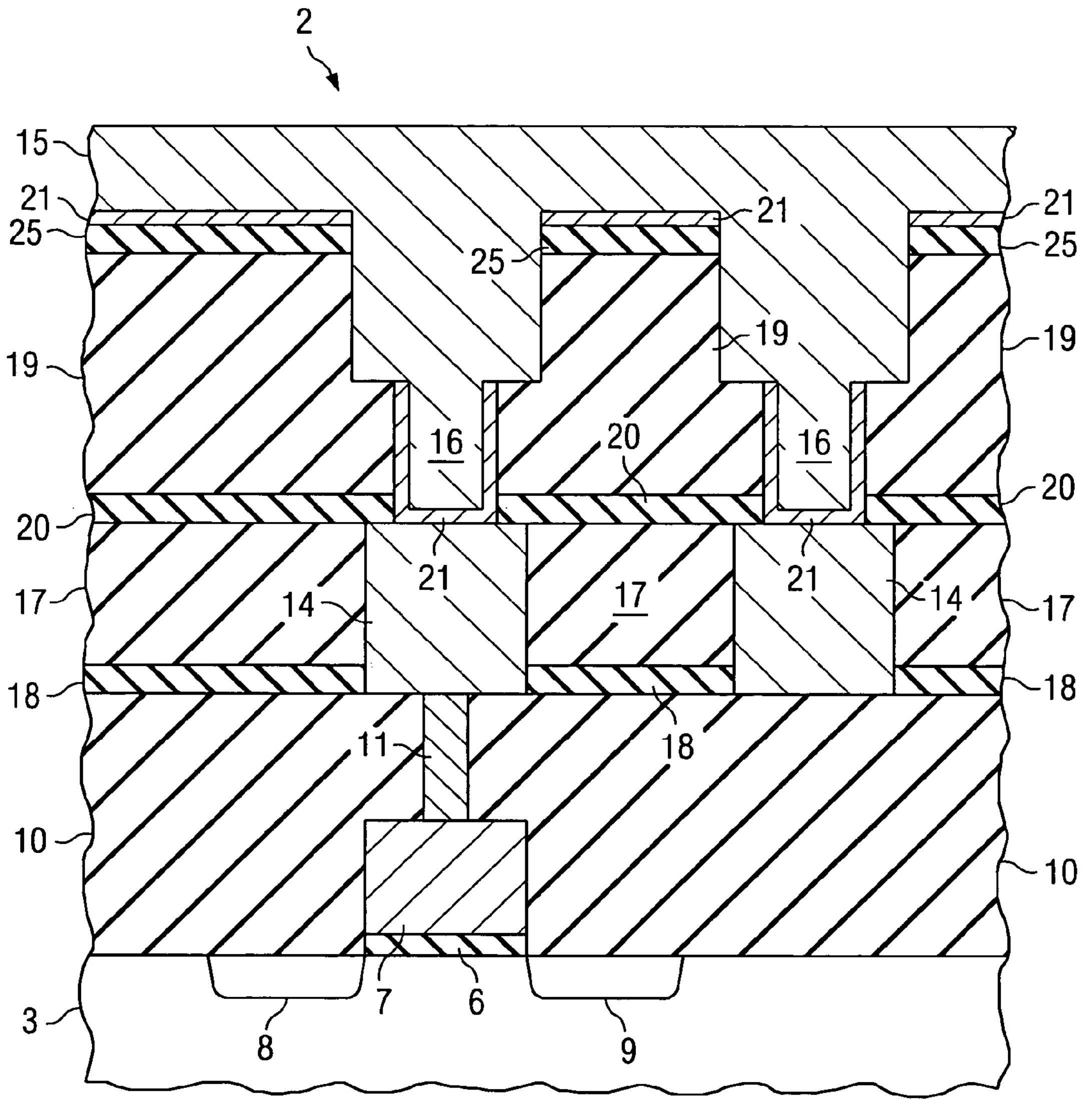

The dual damascene layer is completed by forming the metal trench 15 and via 16 structures. In the preferred application, the metal material is copper; however, the use of other metals such as aluminum or titanium is within the scope of this invention. In step 614 a layer of copper is formed over the substrate, as shown in FIG. 7G. The metal layer is then polished until the top surface of the dielectric 19 is exposed and the metal trenches 15 and metal vias 16 are formed. (The cap layer and the dual damascene pattern liner 21 over the cap layer will also be removed during the polishing process.) The polish step is performed with a Chemical Mechanical Polish ("CMP") process; however, other manufacturing techniques may be used.

If the barrier layer 20 was not etched during via etch, then it will be etched during the trench etch process. Similarly, if a partial via etch was performed (as described above) then the via etch will be completed by etching remainder of the via and possibly the barrier layer 20 during the trench etch process. Moreover, the barrier layer 20 may be etched separately after either the trench etch process or the trench pattern ash process.

The structure of the integrated circuit at this point in the manufacturing process is shown in FIG. 1. However, if the barrier layer 20 was etched along with the trenches, then the structure of the integrated circuit at this point in the manufacturing process is as shown in FIG. 3. Similarly, if the partial via etch, as described above, was performed then the structure of the integrated circuit at this point in the manufacturing process is shown in FIG. 4. However, the trench etch process may etch a portion of the dual damascene pattern liner 21 before the metalization process (step 614).

Now the fabrication any remaining metal layers (such as layer 22 shown in FIG. 2) of the back-end 5 continues (step 616) until the back-end 5 is complete.

Figure 8A:
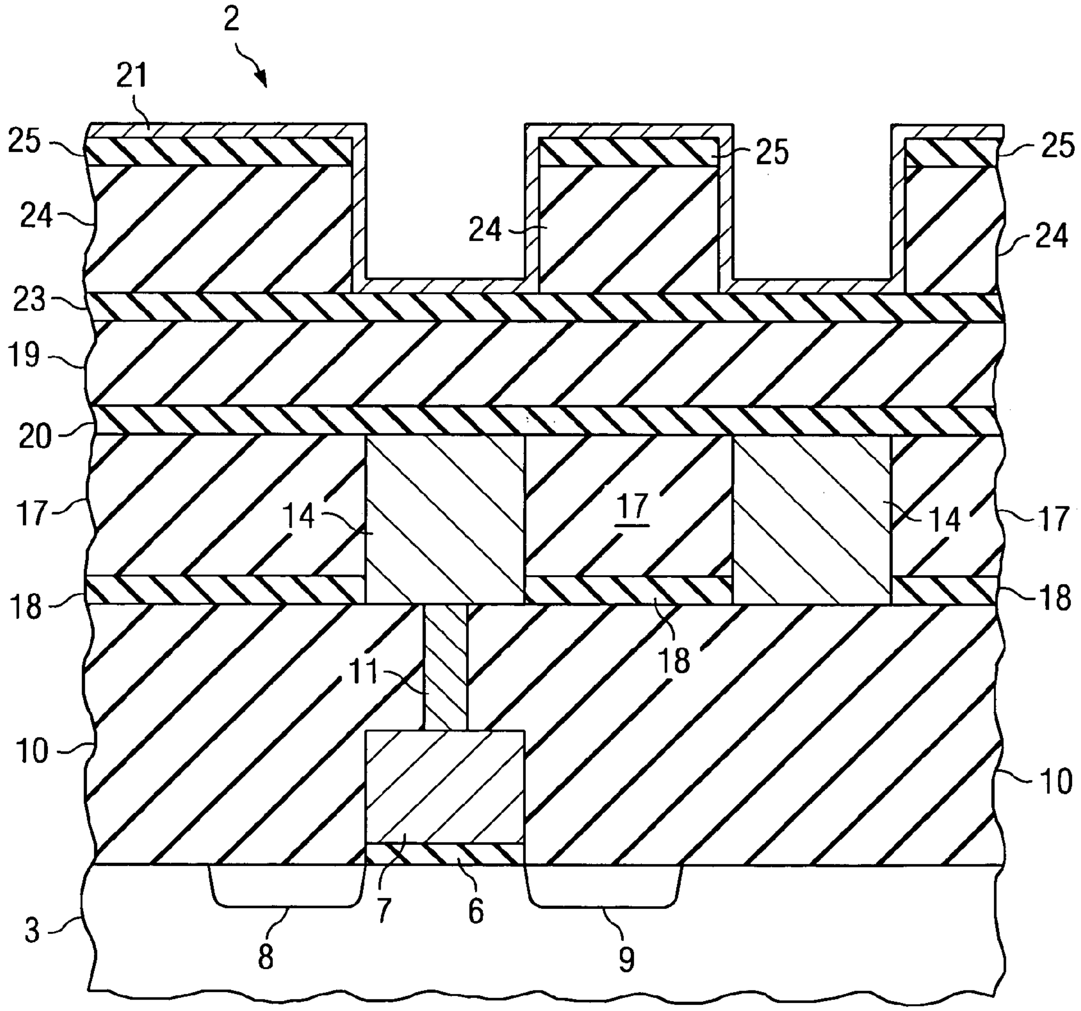
FIGS. 8A and B are cross-sectional diagrams of a process for forming a dual damascene pattern liner in accordance with another embodiment of the present invention.

If a trench-first manufacturing process is used, then the trenches are patterned in step 604 and the trenches are etched in step 606. Next, the dual damascene pattern liner 21 is formed over the trench pattern, as shown in FIG. 8A. Note that the dual damascene pattern liner 21 may be comprised of one or more films, as described above. A trench etch stop layer 23 (preferably comprised of SiN or SiCN) is shown in this application for illustrative purposes. If present, the trench etch stop layer 23 controls the depth of the trench etch process.

Figure 8B:
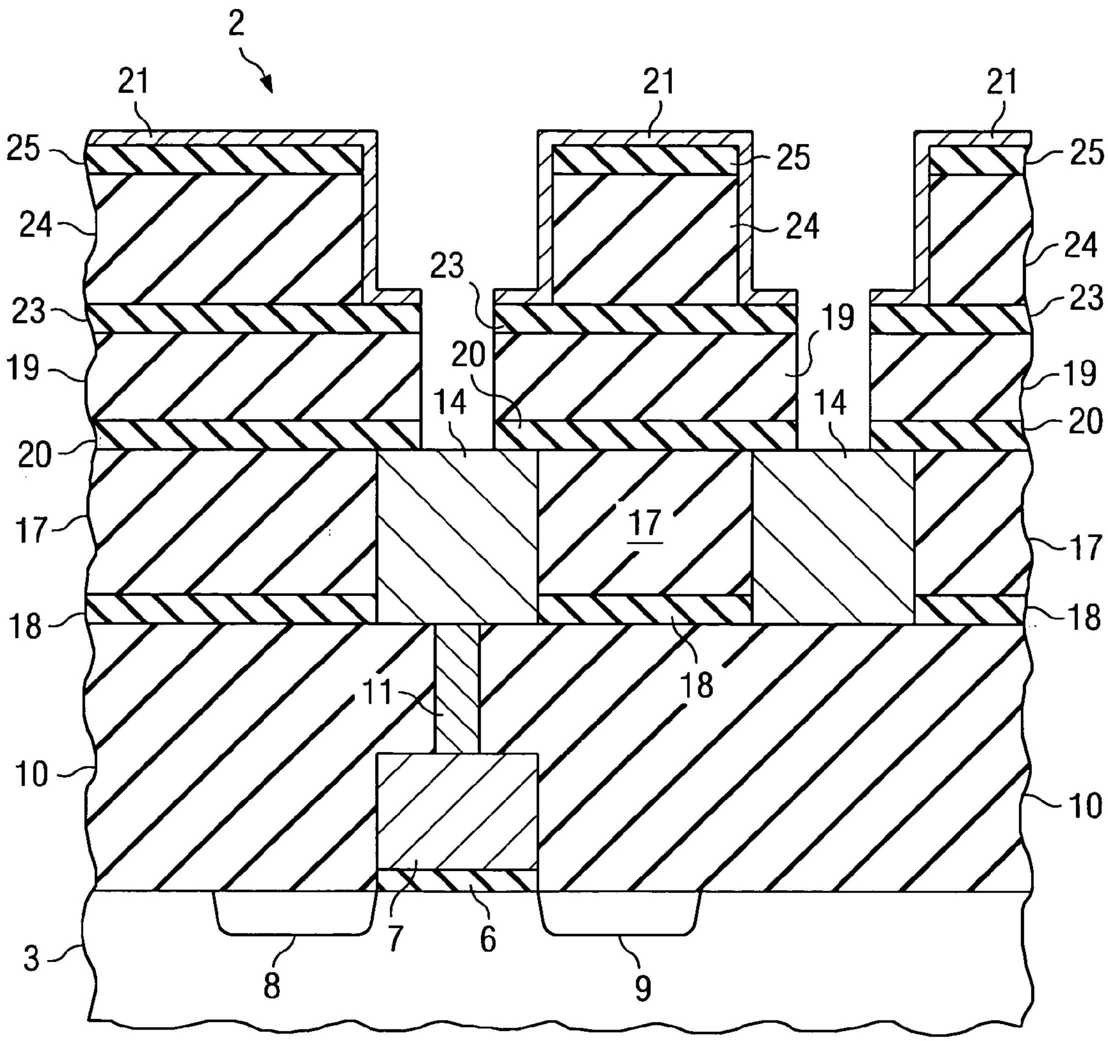

In the trench-first manufacturing process the vias now are patterned and etched (steps 610 and 612). The structure at this point in the manufacturing process is shown in FIG. 8B. After the metalization of the trenches and vias (step 614), the structure will be similar to the structure shown in FIG. 5. Like the via-first manufacturing process, the use of a dual damascene pattern liner 21 in the trench-first process guards against photoresist poisoning during the patterning of the vias. Also like the via-first manufacturing process, the dual damascene pattern liner 21 may be a combination of more than one film. If the dual damascene pattern liner 21 is comprised of a metal film or a metal film in combination with another film (such as a dielectric film), then the metal film would prevent the migration of metal from the trenches 15 and/or vias 16 into the low-k dielectric layer 19.

Various modifications to the invention as described above are within the scope of the claimed invention. As an example, instead of using positive photoresist as described above, negative photoresist may be used. Instead of copper trenches 15 and vias 16, any electrically conductive material such as aluminum or titanium may be used. Similarly, instead of SiC the barrier material 18, 20 may be silicon nitride, silicon oxide, nitrogen-doped silicon carbide, or oxygen doped silicon carbide. In addition, it is within the scope of the invention to have a back-end structure 5 with a different amount or configuration of metal layers 12, 13 than is shown in FIGS. 1–5. The semiconductor substrate includes a semiconductor crystal, typically silicon. Other examples of semiconductors include GaAs and InP. In addition to a semiconductor crystal, the substrate may include various elements therein and/or layers thereon. These can include metal layers, barrier layers, dielectric layers, device structures, active elements and passive elements including word lines, source regions, drain regions, bit lines, bases, emitters, collectors, conductive lines, conductive vias, etc. Moreover, the invention is applicable to other semiconductor technologies such as BiCMOS, bipolar, SOI, strained silicon, pyroelectric sensors, opto-electronic devices, microelectrical mechanical system ("MEMS"), or SiGe.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of manufacturing a semiconductor wafer comprising:

forming a front-end structure over a semiconductor substrate;

forming a single damascene back-end structure metal layer over said front-end structure; and forming a dual damascene back-end structure over said single damascene back-end structure metal layer, said dual damascene back-end structure comprising:

forming a via etch stop layer over said single damascene back-end structure metal layer;

forming a dielectric layer over said via etch stop layer;

forming a cap layer over said dielectric layer;

forming a non-photoactive layer over said cap layer;

forming a photoresist layer over said non-photoactive layer;

patterning said photoresist layer;

etching via holes;

removing said photoresist layer and said non-photoactive layer;

forming a dual damascene pattern liner over said cap layer and within said via holes;

forming a non-photoactive layer over said dual damascene pattern liner;

forming a photoresist layer over said non-photoactive layer patterning said photoresist layer; and etching trench spaces.

2. The method of claim 1 wherein said dielectric layer comprises an Inter-Level Dielectric layer and an Inter-Metal Dielectric layer.

3. The method of claim 1 wherein said dielectric layer comprises an Inter-Level Dielectric layer, a trench stop layer, and an Inter-Metal Dielectric layer.

4. The method of claim 1 wherein said dielectric layer comprises a low-k material.

5. The method of claim 1 wherein said step of etching via holes includes etching said via etch stop layer between said via holes and said single damascene back-end structure metal layer.

6. The method of claim 1 wherein said step of etching via holes comprises etching partial via holes and then completing an etching of said via holes during said step of etching trench spaces.

7. The method of claim 1 further comprising forming at least one additional dual damascene back end structure over said semiconductor substrate.

8. The method of claim 1 wherein said step of forming a dual damascene pattern liner comprises forming a multi-layer dual damascene pattern liner.

9. The method of claim 8 wherein said multi-layer dual damascene pattern liner comprises at least one metal film and at least one dielectric film.

10. The method of claim 1 wherein said dual damascene pattern liner comprises a metal film.

11. The method of claim 1 wherein said dual damascene pattern liner comprises a dielectric film.

12. A method of manufacturing a semiconductor wafer comprising:

forming a front-end structure over a semiconductor substrate;

forming a single damascene back-end structure metal layer over said front-end structure; and forming a dual damascene back-end structure over said single damascene back-end structure metal layer, said dual damascene back-end structure comprising:

forming a via etch stop layer over said single damascene back-end structure metal layer;

forming a dielectric layer over said via etch stop layer;

forming a cap layer over said dielectric layer;

forming a non-photoactive layer over said cap layer;

forming a photoresist layer over said non-photoactive layer;

patterning said photoresist;

etching trench spaces;

removing said photoresist layer and said non-photoactive layer;

forming a dual damascene pattern liner over said cap layer and within said trench spaces;

forming a non-photoactive layer over said dual damascene pattern liner;

forming a photoresist layer over said non-photoactive layer;

patterning said photoresist layer; and etching via holes.

13. The method of claim 12 wherein said dielectric layer comprises an Inter-Level Dielectric layer and an Inter-Metal Dielectric layer.

14. The method of claim 12 wherein said dielectric layer comprises an Inter-Level Dielectric layer, a trench stop layer, and an Inter-Metal Dielectric layer.

15. The method of claim 12 wherein said dielectric layer comprises a low-k material.

16. The method of claim 12 wherein said step of etching via holes includes etching said via etch stop layer between said via holes and said single damascene back-end structure metal layer.

17. The method of claim 12 further comprising forming at least one additional dual damascene back end structure over said semiconductor substrate.

18. The method of claim 12 wherein said step of forming a dual damascene pattern liner comprises forming a multi-layer dual damascene pattern liner.

19. The method of claim 18 wherein said multi-layer dual damascene pattern liner comprises at least one metal film and at least one dielectric film.

20. The method of claim 12 wherein said dual damascene pattern liner comprises a metal film.

21. The method of claim 12 wherein said dual damascene pattern liner comprises a dielectric film.

* * * * *